United States Patent
Shiozawa

(10) Patent No.: US 8,710,455 B2
(45) Date of Patent: Apr. 29, 2014

(54) CHARGED-PARTICLE BEAM LENS

(71) Applicant: Canon Kabushiki Kaisha, Tokyo (JP)

(72) Inventor: Takashi Shiozawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 13/838,785

(22) Filed: Mar. 15, 2013

(65) Prior Publication Data

US 2013/0299714 A1 Nov. 14, 2013

(30) Foreign Application Priority Data

May 14, 2012 (JP) ................... 2012-111035

(51) Int. Cl.
*H01J 37/10* (2006.01)
*H01J 49/42* (2006.01)
*H01J 43/20* (2006.01)

(52) U.S. Cl.
USPC ............ 250/396 R; 257/154; 313/540

(58) Field of Classification Search
USPC ............... 250/396 R, 207, 214, 333; 313/532–534, 540, 103 CM, 105 CM, 313/105 R; 257/154
See application file for complete search history.

(56) References Cited

U.S. PATENT DOCUMENTS

| | | | | |
|---|---|---|---|---|
| 5,220,240 A | * | 6/1993 | Ohoshi et al. | 313/422 |
| 6,133,684 A | * | 10/2000 | Kawaharada | 313/414 |
| 6,917,151 B2 | * | 7/2005 | Kimiya et al. | 313/441 |
| 2002/0101203 A1 | * | 8/2002 | Nagamachi et al. | 315/382 |
| 2004/0195583 A1 | * | 10/2004 | Kaminaga et al. | 257/154 |
| 2004/0232818 A1 | * | 11/2004 | Miyamoto et al. | 313/441 |
| 2005/0023953 A1 | * | 2/2005 | Kimiya et al. | 313/441 |

FOREIGN PATENT DOCUMENTS

| | | |
|---|---|---|
| JP | 2000-311633 A | 11/2000 |
| JP | 2001-118491 A | 4/2001 |
| JP | 2003-045789 A | 2/2003 |
| JP | 2007-242359 A | 9/2007 |

* cited by examiner

*Primary Examiner* — Bernard E Souw
(74) *Attorney, Agent, or Firm* — Canon U.S.A., Inc. IP Division

(57) ABSTRACT

A charged-particle beam lens includes a plate-like anode, a plate-like cathode, and an insulator disposed between the anode and the cathode. The insulator, the anode, and the cathode have a passage portion through which a charged beam is passed. A high-resistance film is formed on an inner side of the insulator, the inner side forming the passage portion, or an outermost side of insulator, and the anode and the cathode are electrically connected together via the high-resistance film. The anode and the high-resistance film, and the cathode and the high-resistance film each contain the same metal or semiconductor element and have different resistant values. This suppresses electric field concentration due to an increase in resistance and poor connection at the interface between the anode and the cathode and the high-resistance film or at the interface between the electroconductive film and the high-resistance film, thus suppressing generation of discharge.

9 Claims, 3 Drawing Sheets

CHARGED-PARTICLE BEAM LENS

BACKGROUND OF THE INVENTION

1. Field of the Invention

One disclosed aspect of the embodiments relates to the technical field of a charged particle beam optical system for use in an apparatus using a charged particle beam, and in particular, to a charged-particle beam lens for use in an exposure apparatus.

2. Description of the Related Art

Electron-beam exposure apparatuses use an electro-optical device for controlling the optical characteristics of an electron beam. There are two types of electron lens, that is, an electromagnetic type and an electrostatic type. The electrostatic type is suitable for size reduction because there is no need to provide a coil core, as compared with the electromagnetic type.

On the other hand, a multibeam system in which a pattern is drawn with a plurality of electron beams without using a mask is one known electron-beam exposure technique. Since the number of beams in the multibeam system corresponds to the number of arrays of electron lenses disposed in the exposure apparatus, a higher array density is required to enhance the throughput.

The electrostatic charged particle lens requires insulating properties (high withstand voltage performance) between electrodes because voltage is applied between the electrodes. To enhance the withstand voltage performance of a charged-particle beam lens, a known method prevents charging of the surface of an insulator sandwiched between electrode substrates by disposing a high-resistance material on the inner wall of the insulator substrate sandwiched between electrode substrates to electrically connect the electrode substrates (see Japanese Patent Laid-Open No. 2001-118491). Another known configuration in a field other than the charged-particle beam lens is a configuration in which a spacer of an electron beam device is covered with a high-resistance film (see Japanese Patent Laid-Open No. 2000-311633).

As the throughput of exposure apparatuses and the definition of exposure patterns have further increased, a higher electric field is required for charged-particle beam lenses. However, there may be a case where conventional charged-particle beam lenses sometimes have insufficient dielectric withstand voltage performance, thus causing discharge. It is clarified that this discharge is caused by the electric field concentration at interfaces between the electrodes and the high-resistance film, as described below, not by charging of the surface of the insulator due to scattered charged particles, disclosed in Japanese Patent Laid-Open No. 2001-118491. The electrostatic type charged-particle beam lens in which a cathode and an anode are electrically connected together by a high-resistance film sometimes generates an oxide film at interfaces between the electrodes and the high-resistance film due to exposure to the atmosphere during a manufacturing process and maintenance of the apparatus. When an electric field is applied between the electrodes, the electric field is concentrated to the interfaces due to high resistance and poor connection of an oxide film portion generated at the interfaces, thus causing discharge due to dielectric breakdown.

SUMMARY OF THE INVENTION

One disclosed aspect of the embodiments provides a charged-particle beam lens including at least one plate-like anode; at least one plate-like cathode; and at least one insulator disposed between the anode and the cathode, wherein the insulator, the anode, and the cathode have at least one passage portion through which a charged beam is passed. A high-resistance film is formed on at least one of an inner side of the insulator, the inner side forming the passage portion, and an outermost side of the insulator. The anode and the cathode are electrically connected together via the high-resistance film. The anode and the high-resistance film, and the cathode and the high-resistance film each contain the same metal or semiconductor element and have different resistant values.

Furthermore, one embodiment provides a charged-particle beam lens including at least one plate-like anode; at least one plate-like cathode; and at least one insulator disposed between the anode and the cathode, wherein the insulator, the anode, and the cathode have at least one passage portion through which a charged beam is passed. A high-resistance film is formed on at least one of an inner side of the insulator, the inner side forming the passage portion, and an outermost side of the insulator. The high-resistance film is electrically connected to the anode and the cathode via an electroconductive film. The electroconductive film and the high-resistance film contain the same metal or semiconductor element and have different resistant values.

According to some embodiments, electric field concentration due to an increase in resistance and poor connection at the interface between the anode and the cathode and the high-resistance film or at the interface between the electroconductive film and the high-resistance film may be suppressed, and thus generation of discharge can be suppressed. As a result, the characteristics of the charged-particle beam lens are stabilized for a long period of time.

Further features of the disclosure will become apparent from the following description of exemplary embodiments with reference to the attached drawings.

DESCRIPTION OF THE EMBODIMENTS

Important features of the embodiments are that a high-resistance film formed on at least one of an inner side of an insulator that forms a passage portion and an outermost side of the insulator and an anode contain the same metal or semiconductor element, that the high-resistance film and a cathode contain the same metal or semiconductor element, and that an electroconductive film and the high-resistance film contains the same metal or semiconductor element. In the embodiments, the same metal or semiconductor element that the high-resistance film and the anode contain and the same metal or semiconductor element that the high-resistance film and the cathode contain may be the same. Furthermore, the same metal or semiconductor element that the anode-side electroconductive film and the high-resistance film contain and the same metal or semiconductor element that the cathode-side electroconductive film and the high-resistance film may be the same. In this basic configuration, furthermore, an outer peripheral side of the anode may be, in the vicinity of the passage portion, disposed inside closer to the passage portion than an outermost side of the insulator and an outer peripheral side of the cathode. In this case, electric filed concentration at the cathode-side triple junction in the vicinity of the lens can be further reduced. Furthermore, the anode-side surface of the insulator also serves as insulator creepage surface, and thus, the insulator creepage distance can be further increased, thus further suppressing generation of creeping discharge in the vicinity of the lens, where displacement during assembly or flaws, cracks, etc., which may cause electric field concentration, are prone to occur.

Embodiments of the disclosure will be described below using the drawings.

First Embodiment

Figure 1A:
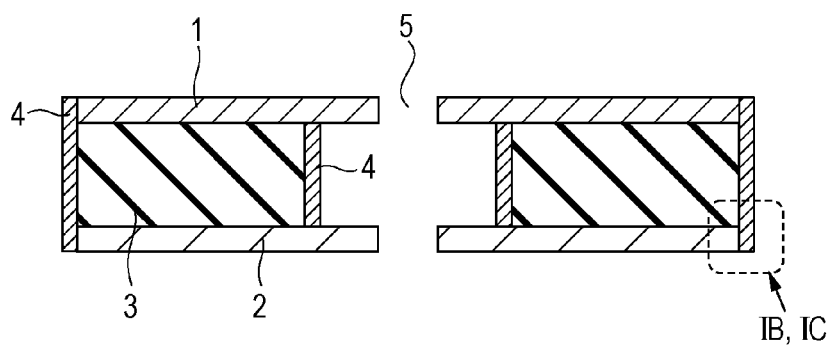
FIG. 1A is a cross-sectional view showing the configuration of a charged-particle beam lens according to a first embodiment.
Figure 1B:
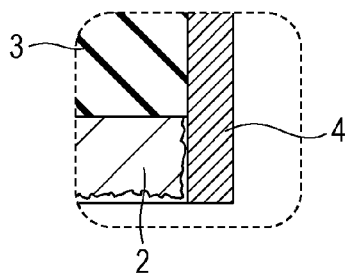
FIG. 1B is an enlarged view of an area IB enclosed by the dotted line in FIG. 1A.
Figure 1C:
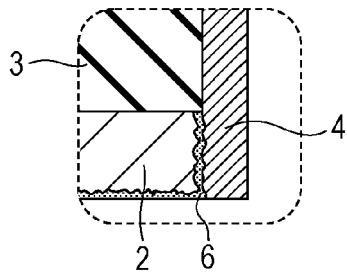
FIG. 1C is an enlarged view of an area IC in the case where the disclosure is not applied.

FIG. 1A is a cross-sectional view showing the configuration of a charged-particle beam lens of a first embodiment; FIG. 1B is an enlarged view of an area IB enclosed by the dotted line in FIG. 1A; and FIG. 1C is an enlarged view of an area IC in the case where the embodiments may not be applied. A plate-like anode 1 and cathode 2 may have sufficient electrical conductivity and may be made of metal or a semiconductor, whose volume resistivity is preferably $1\times10^3$ [Ω·cm] or less. A plate-like insulator 3 is formed of glass or ceramic. At least the anode 1 is disposed on one of the surfaces of the insulator 3, and at least the cathode 2 is disposed on the opposite surface.

A high-resistance film 4 has a resistant value larger than the resistant values of the anode 1 and the cathode 2 and is formed of metal oxide, semiconductor oxide, metal nitride, or semiconductor nitride. The high-resistance film 4 has a resistant value that allows the potential difference between the cathode 2 and the anode 1 to be held and the electrical charge thereof to be eliminated. Preferably, the volume resistivity is $1\times10^4$ [Ω·cm] or more and $1\times10^{14}$ [Ω·cm] or less, and more preferably, $1\times10^9$ [Ω·cm] or more and $1\times10^{12}$ [Ω·cm] or less. The anode 1 and the cathode 2 are electrically connected together via the high-resistance film 4. The high-resistance film 4 is a film containing the same kind of element as those of the anode 1 and the cathode 2 but having a different resistant value from those of the anode 1 and the cathode 2. In the first embodiment, the high-resistance film 4 is formed on both an inner side of the insulator 3 that forms a passage portion 5 and an outermost side of the insulator 3.

The cathode 2, the anode 1, and the insulator 3 each have at least one through-hole (passage portion) 5 through which charged particles (charged beam) emitted from a light source (not shown) pass. Here, assuming that negative voltage is applied to the cathode 2, and the anode 1 is at the earth potential, the charged-particle beam lens of the first embodiment functions as an immersion lens.

Since an exposure apparatus that uses a charged particle beam requires regular maintenance, it is inevitable that the charged-particle beam lens is regularly exposed to the atmosphere. At that time, as shown in FIG. 1C, minute oxide films 6 sometimes grow on the surfaces of the electrodes (the anode 1 and the cathode 2) and interfaces between the electrodes and the high-resistance film 4. The oxidation of the surfaces of the electrodes and the interfaces may be caused because oxygen during maintenance directly acts thereon or diffuses into the high-resistance film 4. In this case, if high voltage is applied between the anode 1 and the cathode 2, electric field concentration sometimes occurs due to an increase in resistance or poor connection due to the oxide film 6 formed on the interfaces.

In the first embodiment, the oxide film 6 and the high-resistance film 4 have substantially the same quality, which can therefore be regarded as equivalent to that the interfaces between the electrodes and the high-resistance film 4 shift toward the electrodes by a distance corresponding to the thickness of the oxide film 6, as shown in FIG. 1B, thus allowing an increase in resistance at the interfaces to be suppressed. Furthermore, since the electrodes and the high-resistance film 4 contain the same elements, good connection can be ensured. This can therefore suppress electric field concentration due to high resistance and poor connection at the interfaces between the electrodes and the high-resistance film 4, thus enhancing the withstand voltage performance.

Figure 1D:
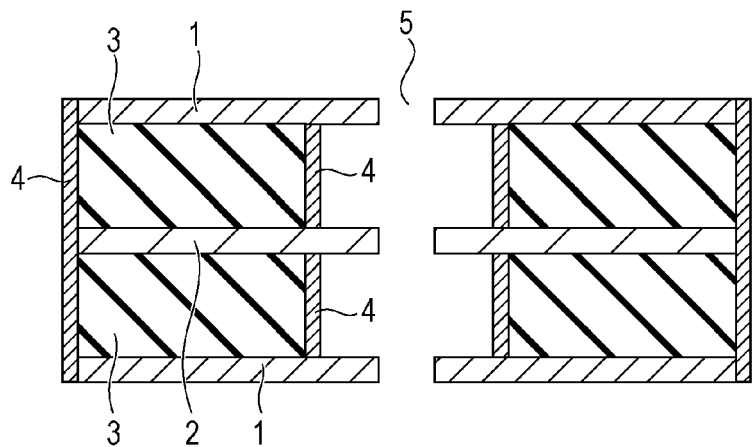
FIG. 1D is a diagram showing the configuration of an Einzel lens of the first embodiment.

FIG. 1D is a diagram showing the configuration of an Einzel lens of the first embodiment. Both the anode 1 and the cathode 2 are disk-like zirconium plates with a thickness of 100 μm and a diameter of 101.6 mm, whose volume resistivity is $4\times10^{-9}$ [Ω·cm]. The insulator 3 is a borosilicate glass disk with a thickness of 400 μm and a diameter of 101.6 mm. The high-resistance film 4 is made of zirconium oxide obtained by adding oxygen to zirconium to adjust the resistance and has a volume resistivity of $1\times10^{12}$ [Ω·cm] and a thickness of 500 nm. The opening diameters of the through-holes 5 in the anode 1 and the cathode 2 are 30 μm, and the opening diameter in the insulator 3 is 4 mm. Here, the anode 1 and the cathode 2 sandwich the insulator 3, with the center axes of the disks aligned.

Next, a method for manufacturing the Einzel lens will be described. For the anode 1 and the cathode 2, the through-holes 5 are formed in the zirconium plates by high-precision photolithography and electrolytic etching. For the insulator 3, the through-hole 5 is formed by sandblasting, and microcracks and burrs on the work surface thereof are processed by wet etching and surface polishing. Next, the processed two anodes 1, one cathode 2, two insulators 3 are joined together in the order of the anode 1, the insulator 3, the cathode 2, the insulator 3, and the anode 1, with the center axes aligned. They are joined together using a silicone-based adhesive having thermal resistance. Next, a zirconium target is sputtered using oxygen gas to form a film, and the film is subjected to a lift-off process to form the high-resistance film 4, and thus, the configuration shown in FIG. 1D is provided.

This configuration prevents a high electric filed from being applied to the joint surfaces between the anode 1 and the cathode 2 and the high-resistance film 4, thus enhancing the withstand voltage performance. When an electron beam was actually made to pass through the through-holes 5, with the cathode 2 given a voltage of −3.7 kV and the two anodes 1 at the earth potential, no discharge was observed. Furthermore, when an electron beam was actually made to pass through the through-holes 5 by the same method after a plurality of maintenance processes, no discharge was observed. Thus, it was confirmed that a high-reliability electronic lens capable of maintaining a desired lens action stably for a long time can be configured.

Second Embodiment

Figure 2A:
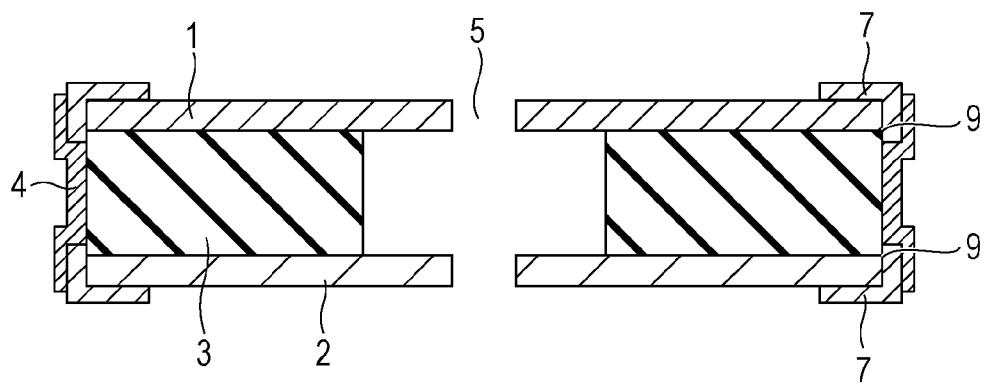
FIG. 2A is a cross-sectional view showing the configuration of a charged-particle beam lens according to a second embodiment.

Next, a second embodiment will be described using FIGS. 2A and 2B. FIG. 2A is a cross-sectional view showing the configuration of a charged-particle beam lens of the second embodiment. In the second embodiment, electroconductive films 7 are formed on the anode 1 and the cathode 2 of the first embodiment. Although the electroconductive films 7 are disposed at least between the anode 1 and the high-resistance film 4 and between the cathode 2 and the high-resistance film 4, the electroconductive films 7 may be configured to cover the anode 1 and the cathode 2.

The electroconductive films 7 are formed of metal or a semiconductor, whose volume resistivity is $1 \times 10^3$ [Ω·cm] or less. The high-resistance films 4 contain the same kind of element as that of the electroconductive film 7 but differs in resistant value from the electroconductive film 7, and the volume resistivity of the high-resistance film 4 is $1 \times 10^4$ [Ω·cm] or more and $1 \times 10^{14}$ [Ω·cm] or less, preferably, $1 \times 10^9$ [Ω·cm] or more and $1 \times 10^{12}$ [Ω·cm] or less. In this case, since the materials of the anode 1 and the cathode 2 can be selected independently of the high-resistance film 4 and the electroconductive film 7, a material having higher processing performance than that of the first embodiment can be selected. As described above, the configuration of the second embodiment can further enhance the lens processing precision and remarkably improve the withstand voltage performance.

Figure 2B:
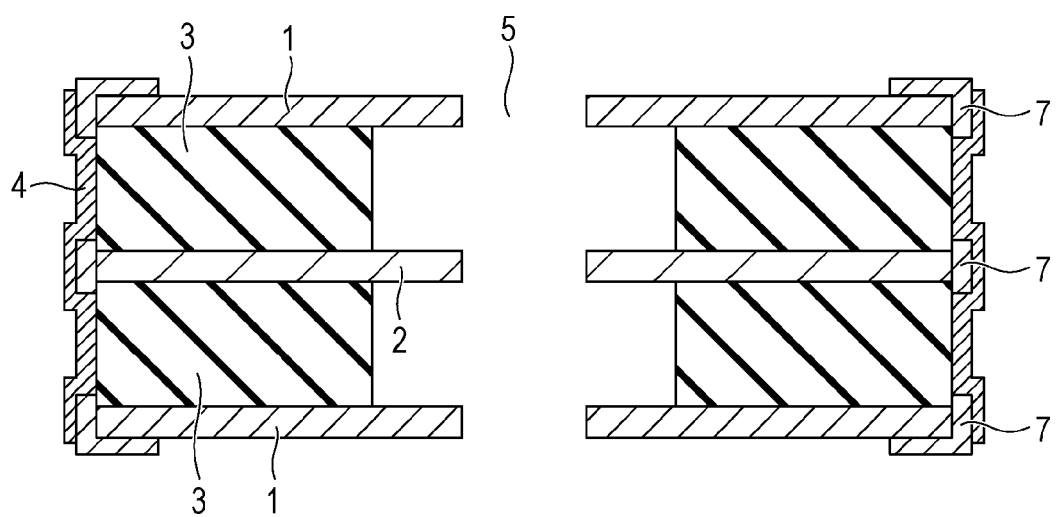
FIG. 2B is a diagram showing the configuration of an Einzel lens of the second embodiment.

FIG. 2B is a diagram showing the configuration of an Einzel lens of the second embodiment. This Einzel lens is manufactured from the same material, in the same size, and by the same manufacturing method as those of the Einzel lens in the first embodiment, except the parts described below. The anode 1 and the cathode 2 are both-side polished single-crystal disk-shaped silicon substrates having high processing performance. The electroconductive film 7 is made of zirconium having a volume resistivity of $4 \times 10^{-9}$ [Ω·cm] and a thickness of 300 nm and is formed so as to cover triple junctions 9 of the anode 1 and the cathode 2.

After formation of the through-holes 5 and joining have been performed similarly to the Einzel lens of the first embodiment, the electroconductive films 7 are formed by a lift-off process on a sputtered film, and the high-resistance films 4 (zirconium oxide) are similarly formed, and thus, the configuration shown in FIG. 2B is provided. This configuration allows the materials of the anode 1 and the cathode 2 to be freely selected, thus allowing generation of discharge to be suppressed while enhancing the lens processing precision. When an electron beam was actually made to pass through the through-holes 5, with the cathode 2 given a voltage of −3.7 kV and the two anodes 1 at the earth potential, no discharge was observed. Furthermore, when an electron beam was actually made to pass through the through-holes 5 by the same method after a plurality of maintenance processes, no discharge was observed. Thus, it was confirmed that a high-reliability electronic lens capable of maintaining a desired lens action stably for a long time can be configured.

Third Embodiment

Figure 3A:
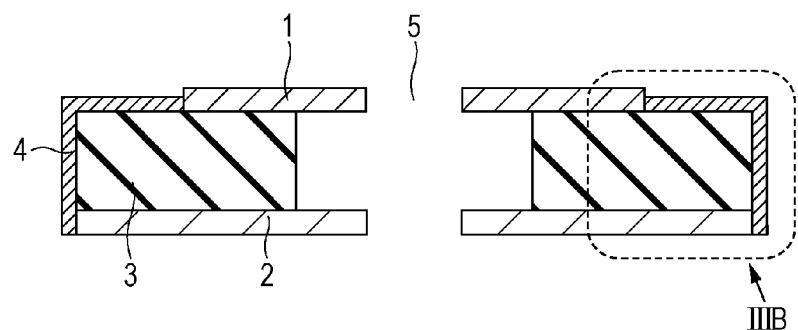
FIG. 3A is a cross-sectional view showing the configuration of a charged-particle beam lens according to a third embodiment.
Figure 3B:
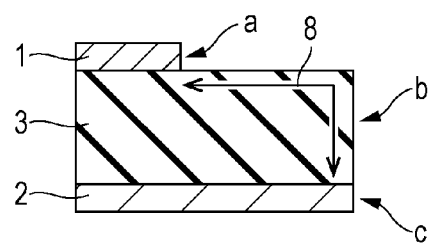
FIG. 3B is an enlarge view of an area IIIB enclosed by the dotted line in FIG. 3A.

Next, a third embodiment will be described using FIGS. 3A to 3D. FIG. 3A is a cross-sectional view showing the configuration of a charged-particle beam lens of the third embodiment. FIG. 3B is an enlarge view of an area IIIB enclosed by the dotted line in FIG. 3A (the high-resistance film 4 is not shown). In this embodiment, an outer peripheral side a of the anode 1 is disposed inside an outer peripheral side c of the cathode 2 and an outermost side b of the insulator 3 (at the through-hole 5 side).

The electrostatic charged-particle beam lens has a configuration in which electrodes are layered, with an insulator therebetween, in which the boundary between a vacuum region, the insulator, and the electrodes is the triple junction 9. When an electric field is applied between the electrodes, creeping discharge tends to occur on the surface of the insulator due to electron emission from the cathode-side triple junction 9 due to an electric field concentration effect, a secondary electron avalanche phenomenon on the surface of the insulator, and so on.

Figure 3C:
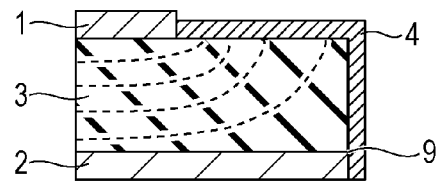
FIG. 3C is a diagram showing equipotential lines in the configuration of FIG. 3B.

In the third embodiment, as shown in FIG. 3B, a creepage distance 8 of the insulator 3 over which the high-resistance film 4 is formed is larger than the thickness of the insulator 3. The broken lines shown in FIG. 3C are equipotential lines in this configuration, which shows that an electric field applied to the cathode-side triple junction 9 in the vicinity of the lens can be reduced. As described above, according to the third embodiment, since a creepage distance larger than the thickness of the insulator 3 is ensured to reduce the electric field at the cathode-side triple junction 9, and furthermore, the electrodes and the high-resistance film 4 contain the same element, electric field concentration can be suppressed while good connection is ensured. Accordingly, the withstand voltage performance can be further enhanced. Also in this case, the anode 1, the cathode 2, and the high-resistance film 4 may be joined via the electroconductive film 7 therebetween, as in the second embodiment.

Figure 3D:
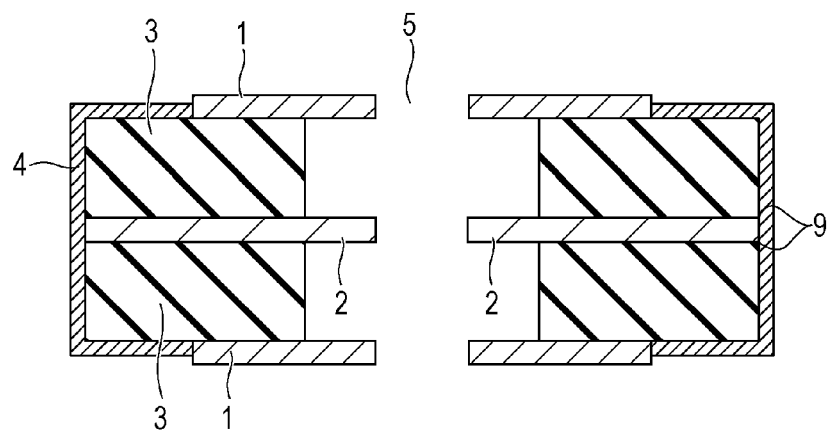
FIG. 3D is a diagram showing a configuration of the Einzel lens of the third embodiment.

FIG. 3D is a diagram showing the configuration of the Einzel lens of the third embodiment. This Einzel lens is manufactured from the same material, in the same size, and by the same manufacturing method as those of the Einzel lens in the first embodiment, except the parts described below. The anode 1 is a disk-like zirconium plate with a thickness of 100 μm and a diameter of 98 μm smaller than the diameters of the cathode 2 and the insulator 3. The high-resistance film 4 is formed of zirconium oxide obtained by adding oxygen to zirconium to adjust the resistance and has a volume resistivity of $1 \times 10^{12}$ [Ω·cm] and a thickness of 500 nm.

After formation of the through-holes 5 and joining have been performed similarly to the Einzel lens of the first embodiment, the high-resistance film 4 is formed by a lift-off process on a sputtered film, and thus, the configuration in FIG. 3D is provided. This configuration reduces the electric field at the cathode-side triple junction 9 in the vicinity of the lens and increases the insulator creepage distance, thus further enhancing the withstand voltage performance. When an electron beam was actually made to pass through the through-holes 5, with the cathode 2 given a voltage of −3.7 kV and the two anodes 1 at the earth potential, no discharge was observed. Furthermore, when an electron beam was actually made to pass through the through-holes 5 by the same method after a plurality of maintenance processes, no discharge was observed. Thus, it was confirmed that a high-reliability electronic lens capable of maintaining a desired lens action stably for a long time can be configured.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-111035 filed May 14, 2012, which is hereby incorporated by reference herein in its entirety.

What is claimed is:

1. A charged-particle beam lens comprising:
   at least one plate-like anode;
   at least one plate-like cathode; and
   at least one insulator disposed between the anode and the cathode, wherein the insulator, the anode, and the cathode have at least one passage portion through which a charged beam is passed,
   wherein a high-resistance film is formed on at least one of an inner side of the insulator, the inner side forming the passage portion, and an outermost side of the insulator;
   the anode and the cathode are electrically connected together via the high-resistance film; and
   the anode and the high-resistance film, and the cathode and the high-resistance film each contain the same metal or semiconductor element and have different resistant values.

2. A charged-particle beam lens comprising:
   at least one plate-like anode;
   at least one plate-like cathode; and
   at least one insulator disposed between the anode and the cathode, wherein the insulator, the anode, and the cathode have at least one passage portion through which a charged beam is passed,
   wherein a high-resistance film is formed on at least one of an inner side of the insulator, the inner side forming the passage portion, and an outermost side of the insulator;
   the high-resistance film is electrically connected to the anode and the cathode via an electroconductive film; and
   the electroconductive film and the high-resistance film contain the same metal or semiconductor element and have different resistant values.

3. The charged-particle beam lens according to claim 1, wherein
   an outer peripheral side of the anode is disposed inside the outermost side of the insulator, and
   an outer peripheral side of the cathode is disposed outside the outer peripheral side of the anode.

4. The charged-particle beam lens according to claim 1, wherein the anode and the cathode are made of metal or a semiconductor.

5. The charged-particle beam lens according to claim 4, wherein the high-resistance film is made of one of metal oxide, semiconductor oxide, metal nitride, and semiconductor nitride.

6. The charged-particle beam lens according to claim 2, wherein the electroconductive film is made of metal or a semiconductor.

7. The charged-particle beam lens according to claim 6, wherein the anode and the cathode are made of a different material from that of the electroconductive film.

8. The charged-particle beam lens according to claim 1, wherein the high-resistance film has a resistant value higher than the resistant value of the anode and the resistant value of the cathode and has a volume resistivity of $1\times10^4$ [$\Omega\cdot$cm] or more and $1\times10^{14}$ [$\Omega\cdot$cm] or less.

9. The charged-particle beam lens according to claim 7, wherein the electroconductive film has a resistant value lower than those of the anode and the cathode.

* * * * *